(12) United States Patent
Lee et al.

(10) Patent No.: US 9,336,877 B2
(45) Date of Patent: May 10, 2016

(54) NONVOLATILE MEMORY DEVICE USING VARIABLE RESISTIVE ELEMENT

(71) Applicant: SAMSUNG ELECTRONICS CO., LTD., Suwon-Si, Gyeonggi-Do (KR)

(72) Inventors: Jae-Yun Lee, Anyang-si (KR); Sun Woo-Jung, Seoul (KR); Kwang-Jin Lee, Hwaseong-si (KR); Dong-Hoon Jeong, Changwon-si (KR); Beak-Hyung Cho, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/504,914

(22) Filed: Oct. 2, 2014

(65) Prior Publication Data

US 2015/0179257 A1 Jun. 25, 2015

(30) Foreign Application Priority Data

Dec. 24, 2013 (KR) .................. 10-2013-0162594

(51) Int. Cl.
| | |
|---|---|
| *G11C 8/08* | (2006.01) |
| *G11C 13/00* | (2006.01) |
| *G11C 7/02* | (2006.01) |
| *G11C 7/10* | (2006.01) |
| *G11C 7/18* | (2006.01) |

(52) U.S. Cl.
CPC ............. *G11C 13/0069* (2013.01); *G11C 7/02* (2013.01); *G11C 7/1006* (2013.01); *G11C 7/18* (2013.01); *G11C 13/004* (2013.01); *G11C 13/0026* (2013.01); *G11C 2211/5623* (2013.01); *G11C 2213/71* (2013.01)

(58) Field of Classification Search
CPC .............................. G11C 13/0069; G11C 8/08
USPC ............................................ 365/148, 230.06
See application file for complete search history.

(56) References Cited

U.S. PATENT DOCUMENTS

| | | | |
|---|---|---|---|
| 6,260,103 B1 | 7/2001 | Alexis et al. | |
| 6,552,936 B2 | 4/2003 | Shiga et al. | |
| 7,200,045 B2 * | 4/2007 | Lue ................... | G11C 16/0466 365/185.18 |
| 7,257,027 B2 | 8/2007 | Park | |
| 7,339,825 B2 | 3/2008 | Iioka et al. | |
| 7,602,643 B2 | 10/2009 | Cho | |
| 7,929,337 B2 | 4/2011 | Choi et al. | |
| 8,139,432 B2 | 3/2012 | Choi et al. | |
| 8,199,584 B2 | 6/2012 | Park | |
| 8,300,474 B2 | 10/2012 | Fujita | |
| 8,503,218 B2 | 8/2013 | Kim et al. | |
| 2008/0098163 A1 | 4/2008 | Lin | |
| 2011/0242885 A1* | 10/2011 | Kim ................... | G11C 13/0004 365/163 |

(Continued)

FOREIGN PATENT DOCUMENTS

KR 1020130070926 A 6/2013

*Primary Examiner* — Michael Tran
(74) *Attorney, Agent, or Firm* — Volentine & Whitt, PLLC

(57) ABSTRACT

A nonvolatile memory device utilizes a variable resistive element. The nonvolatile memory device includes a plurality of banks and first to third write global bit lines arranged to cross the plurality of banks. Each of the plurality of banks includes a plurality of nonvolatile memory cells using resistive material. The first, the second and the third write global bit lines are disposed directly adjacent to one another in order. When a write current is supplied to the first write global bit line during a write period, a fixed voltage is applied to the second write global bit line while the third global bit line floats.

18 Claims, 15 Drawing Sheets

(56) References Cited

U.S. PATENT DOCUMENTS

| | | | |
|---|---|---|---|
| 2011/0299340 A1* | 12/2011 | Samachisa | G11C 16/06 365/185.21 |
| 2012/0026777 A1 | 2/2012 | Kitagawa et al. | |
| 2012/0243319 A1 | 9/2012 | Kasai et al. | |
| 2012/0324147 A1 | 12/2012 | Lai | |
| 2012/0327711 A1 | 12/2012 | Shim et al. | |
| 2013/0010550 A1 | 1/2013 | Kim et al. | |
| 2013/0051113 A1* | 2/2013 | Kwon | G11C 17/06 365/105 |
| 2013/0188431 A1* | 7/2013 | Scheuerlein | G11C 7/04 365/189.09 |

* cited by examiner

NONVOLATILE MEMORY DEVICE USING VARIABLE RESISTIVE ELEMENT

CROSS-REFERENCE TO RELATED APPLICATION

A claim of priority under 35 U.S.C. §103 is made to Korean Patent Application No. 10-2013-0162594 filed on Dec. 24, 2013 in the Korean Intellectual Property Office, the contents of which in its entirety are herein incorporated by reference.

BACKGROUND

The present inventive concept relates to nonvolatile memory devices which utilize a variable resistive element to store data.

Examples of a nonvolatile memory device that utilize variable resistance materials include phase change random access memory (PRAM), resistive RAM (RRAM), a magnetic RAM (MRAM), and the like. In contrast to dynamic RAM (DRAM) device and flash memory which store data according to an electric charge, variable resistance memory devices are characterized by storing data according to a programmable resistance of a variable resistance material. As examples, data may be stored according to a change in state of a phase change material (PRAM), such as a chalcogenide alloy, a change in resistance of a variable resistive material (RRAM), and a change in resistance of a magnetic tunnel junction (MTJ) thin film due to a magnetization state of a ferromagnetic substance (MRAM).

The description of embodiments described later herein use a phase change memory cell as an example. A state of a phase change material is changed to a crystal state or an amorphous state by controlling a heating process and subsequent cooling process applied to the material. Since the phase change material in the crystal state has low resistance and the phase change material in the amorphous state has high resistance, the crystal state may be defined as set data or 0 data, and the amorphous state may be defined as reset data or 1 data.

SUMMARY

According to an aspect of the present inventive concept, there is provided a nonvolatile memory device including a plurality of banks and first to third write global bit lines arranged to cross the plurality of banks. Each of the plurality of banks includes a plurality of nonvolatile memory cells using resistive material. The first, the second and the third write global bit lines are disposed directly adjacent to one another in order. When a write current is supplied to the first write global bit line during a write period, a fixed voltage is applied to the second write global bit line while the third global bit line floats.

According to another aspect of the present inventive concept, there is provided a nonvolatile memory device including a plurality of banks, a plurality of even-numbered write global bit lines and a plurality of odd-numbered write global bit lines arranged to cross the plurality of banks. Each of the plurality of banks includes a plurality of nonvolatile memory cells using resistive material. When a write current is supplied to at least one of the plurality of even-numbered write global bit lines during a write period, a fixed voltage is applied to the plurality of odd-numbered write global bit lines.

BRIEF DESCRIPTION OF THE DRAWINGS

The above and other features and advantages of the present inventive concept will become readily apparent from the detail description that follows, with reference to the attached drawings, in which.

DETAILED DESCRIPTION OF THE EMBODIMENTS

Figure 1:
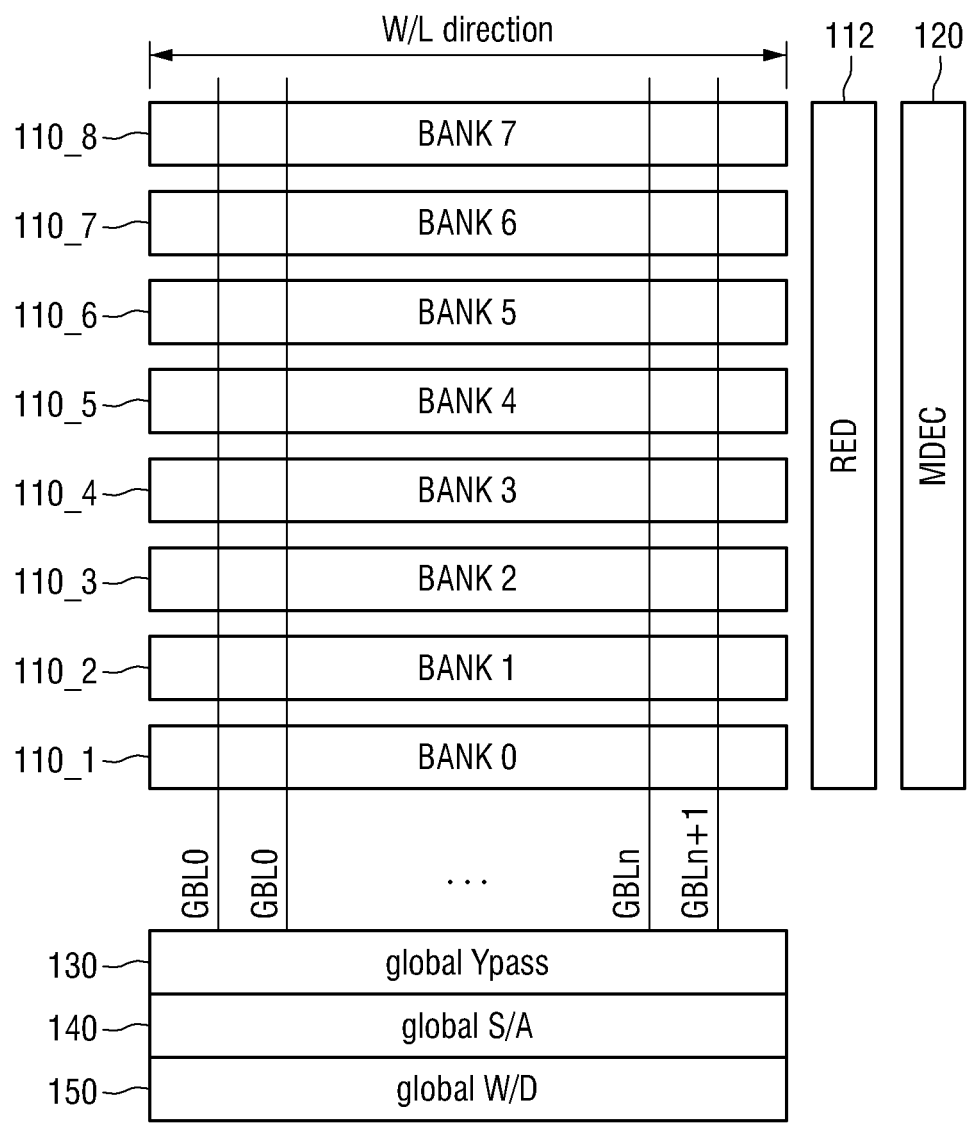
FIG. 1 is a block diagram illustrating a nonvolatile memory device according to embodiments of the present inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, a description will be made of embodiments of the present inventive concept by using phase change random access memory (PRAM) devices. However, it will be understood by those skilled in the art that the present inventive concept can be applied to other types of nonvolatile memory devices using variable resistive elements, such as resistive RAM (RRAM) devices, magnetic RAM (MRAM) devices, and the like.

FIG. 1 is a block diagram illustrating a nonvolatile memory device according to embodiments of the present inventive concept.

Referring to FIG. 1, the nonvolatile memory device according to embodiments of the present inventive concept includes a plurality of memory banks 110_1 to 110_8, a global column select circuit 130, a global sense amplifier circuit 140, global write driver circuit 150, a redundant memory cell array 112, and a main word line decoder 120. Each of the memory banks 110_1 to 110_8 includes a plurality of nonvolatile memory cells using resistive material.

In detail, when a nonvolatile memory cell is a PRAM cell, the nonvolatile memory cell may include a variable resistive element (GST) that contains a phase change material and an access element (D) that controls a current flowing through the variable resistive element GST. The access element D may be a diode, an FET transistor, an NPN bipolar transistor, a PNP bipolar transistor, or the like, which is connected in series to the variable resistive element GST, but aspects of the present inventive concept are not limited thereto. Further, examples of the phase change materials may include various kinds of material, such as GaSb, InSb, InSe, $Sb_2Te_3$, and GeTe in which two elements are chemically combined with each other, GeSbTe, GaSeTe, InSbTe, $SnSb_2Te_4$, and InSbGe in which three elements are chemically combined with one another, and AgInSbTe, (GeSn)SbTe, GeSb(SeTe), and $Te_{81}Ge_{15}Sb_2S_2$ in which four elements are chemically combined with one another. Among them, GeSbTe that contains germanium (Ge), antimony (Sb) and tellurium (Te) is mainly used as the phase change material.

Meanwhile, when a nonvolatile memory cell is an RRAM cell, the variable resistive element may include, for example, NiO or perovskite. Perovskite may be a composition, such as manganite (for example, $Pr_{0.7}Ca_{0.3}MnO_3$, $Pr_{0.5}Ca_{0.5}MnO_3$, PCMO, or LCMO), titanate (for example, STO:Cr), zirconate (for example, SZO:Cr, $Ca_2Nb_2O_7$:Cr or $Ta_2O_5$:Cr), or the like. In particular, a filament is formed in the variable resistive element, and the filament serves as a current path of a cell current that flows through the nonvolatile memory cell.

Meanwhile, along with the large-capacity high-integration tendency of nonvolatile memory devices, the nonvolatile memory devices may be implemented to have a hierarchical bit line structure using global bit lines and local bit lines, and a hierarchical word line structure using main word lines and sub word lines. In such a case, in the nonvolatile memory devices according to embodiments of the present inventive concept, as shown in FIG. 1, the respective global bit lines GBL0 to GBLn+1 are arranged to correspond to the plurality of memory banks 110_1 to 110_8 (that is, arranged to cross the plurality of memory banks 110_1 to 110_8), and the respective main word lines are arranged in one of the plurality of memory banks 110_1 to 110_8.

Here, the global sense amplifier circuit 140 is coupled to the plurality of global bit lines GBL0 to GBLn+1 and reads data from nonvolatile memory cells positioned in the plurality of memory banks 110_1 to 110_8 through the global bit lines GBL0 to GBLn+1. The global write driver circuit 150 is coupled to the plurality of global bit lines GBL0 to GBLn+1 and writes data to nonvolatile memory cells positioned in the plurality of memory banks 110_1 to 110_8 through the global bit lines GBL0 to GBLn+1.

In addition, the main word line decoder 120 is coupled to the plurality of main word lines to selectively select the plurality of main word lines arranged to correspond to the plurality of memory banks 110_1 to 110_8. In addition, the redundant memory cell array 112 is arranged to be shared by the plurality of memory banks 110_1 to 110_8. As described above, the main word line decoder 120 and the redundant memory cell array 112 are arranged to be shared by the plurality of memory banks 110_1 to 110_8, thereby reducing an area of a core structure.

Figure 2:
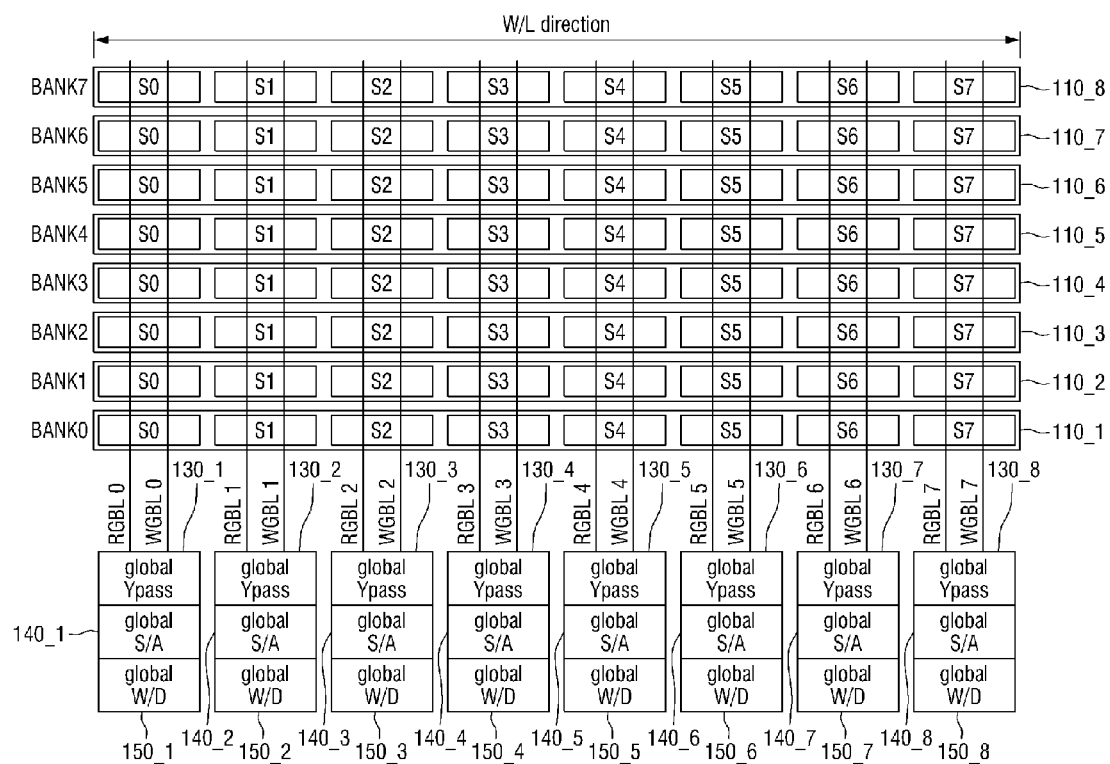
FIG. 2 is a block diagram illustrating a nonvolatile memory device according to an embodiment of the present inventive concept.

FIG. 2 is a block diagram illustrating a nonvolatile memory device according to an embodiment of the present inventive concept.

Referring to FIG. 2, the nonvolatile memory device according to an embodiment of the present inventive concept may include write global bit lines WGBL0 to WGBL7 used when data is written in the plurality of memory banks 110_1 to 110_8, and read global bit lines RGBL0 to RGBL7 used when data is read from the plurality of memory banks 110_1 to 110_8. As described above, when the nonvolatile memory device according to an embodiment of the present inventive concept include the write global bit lines WGBL0 to WGBL7 and the read global bit lines RGBL0 to RGBL7, the nonvolatile memory device may perform a read while write (RWW) operation.

The RWW operation means a read operation performed while a write operation is performed. For example, a write operation may be performed in a region and a read operation may be performed in another region at the same time with the write operation. The RWW operation will later be described with reference to FIG. 5.

In addition, in the nonvolatile memory device, each of the memory banks 110_1 to 110_8 may be divided into the plurality of sub blocks S0 to S7. In addition, the global sense amplifier circuit (140 of FIG. 1) may include first to eighth global sense amplifier circuits 140_1 to 140_8 corresponding to the plurality of sub blocks S0 to S7, the global write driver circuit (150 of FIG. 1) may include first to eighth global write driver circuits 150_1 to 150_8 corresponding to the plurality of sub blocks S0 to S7, and the global column select circuit (130 of FIG. 1) may include first to eighth global column select circuits 130_1 to 130_8 corresponding to the plurality of sub blocks S0 to S7.

Figure 3:
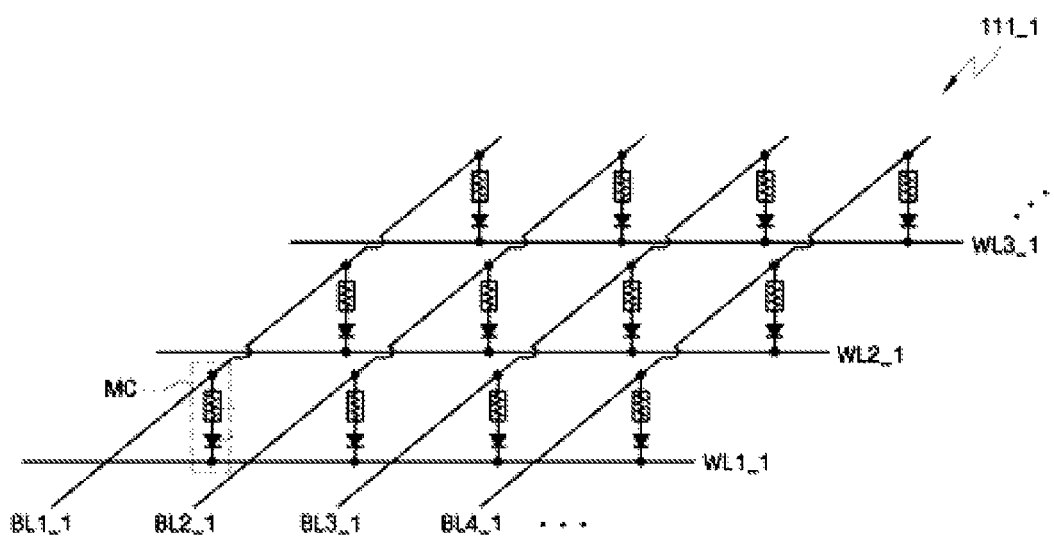
FIGS. 3 and 4 are diagrams illustrating examples of memory banks shown in FIGS. 1 and 2.
Figure 4:
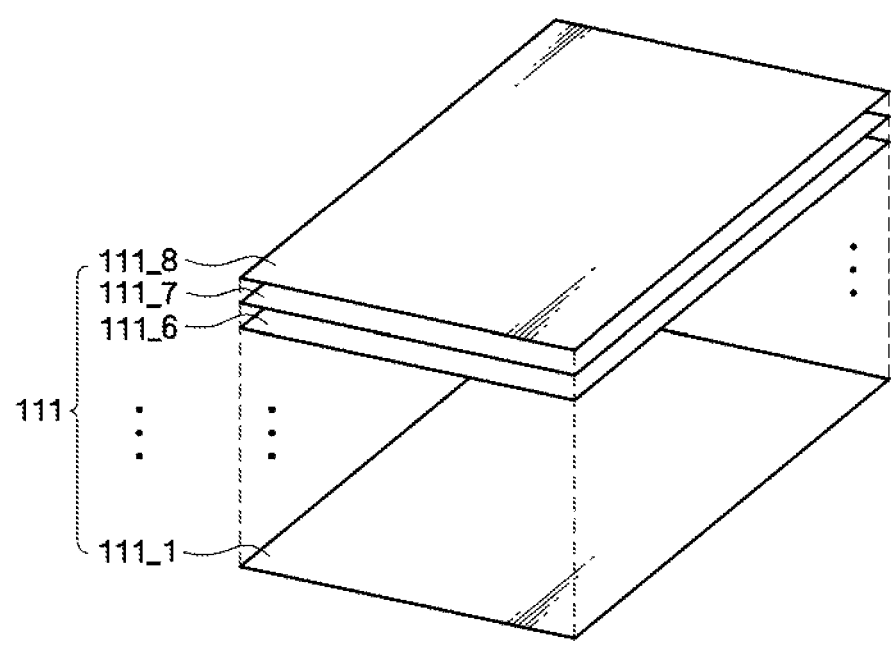

FIGS. 3 and 4 are diagrams illustrating examples of memory banks shown in FIGS. 1 and 2.

Referring to FIG. 3, each memory bank may have a cross point structure. The cross point structure is a structure in which a memory cell is formed at an intersection of a line and another line. For example, bit lines BL1_1 to BL4_1 extend in a first direction, word lines WL1_1 to WL3_1 extend in a second direction so as to cross the bit lines BL1_1 to BL4_1, and nonvolatile memory cells MC may be formed at intersections of the respective bit lines BL1_1 to BL4_1 and the respective WL1_1 to WL3_1.

Alternatively, each memory bank, as shown in FIG. 4, may have a three-dimension (3D) stacked structure. The 3D stacked structure is a structure in which the plurality of memory cell layers 111_1 to 111_are vertically stacked. In FIG. 4, for example, eight memory cell layers 111_1 to 111_8 are stacked, but aspects of the present inventive concept are not limited thereto. Here, each of the memory cell layers 111_1 to 111_8 may include a plurality of memory cell groups and/or a plurality of redundant memory cell groups. If a memory cell array has a 3D stacked structure, each of the memory cell layers 111_1 to 111_8 may have a cross point structure shown in FIG. 3, but aspects of the present inventive concept are not limited thereto.

Figure 5:
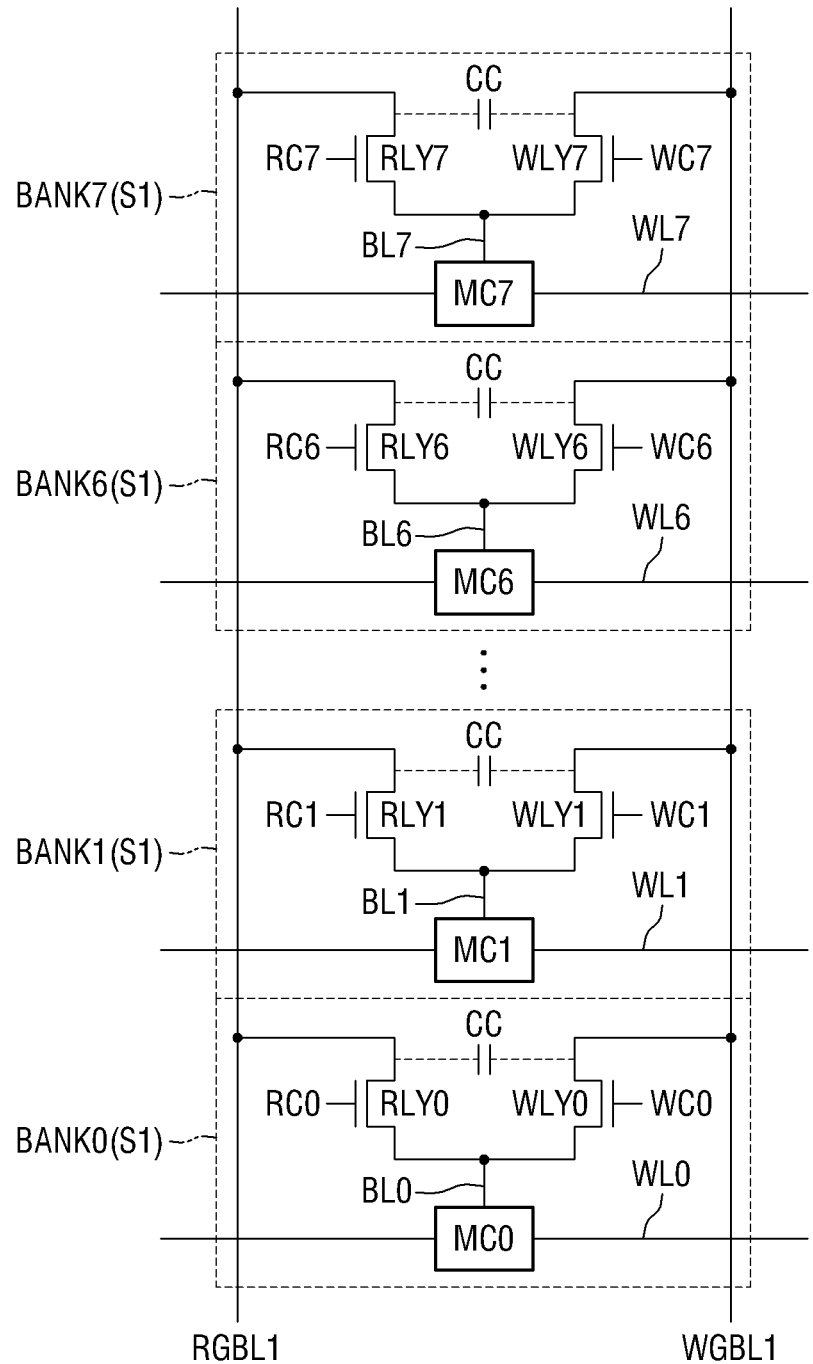
FIG. 5 is a diagram illustrating an example of a relationship between each of a sub block, a write global bit line, and a read global bit line shown in FIG. 2.

FIG. 5 is a detailed diagram illustrating an example of a relationship between each of a sub block, a write global bit line, and a read global bit line shown in FIG. 2.

Referring to FIG. 5, a write global bit line WGBL1 and a read global bit line RGBL1 may be arranged to cross the plurality of banks BANK0 to BANK7.

For brevity, one of the nonvolatile memory cells MC0 to MC7 provided in each of the banks BANK0 to BANK7 is illustrated. In the illustrated embodiment, each of the nonvolatile memory cells MC0 to MC7 is connected to local bit line BL0 to BL7 and sub word lines WL0 to WL7. Local column select circuits WLY0 to WLY7 may be arranged between the local bit line BL0 to BL7 and the write global bit line WGBL1, and local column select circuits RLY0 to RLY7 may be arranged between the local bit line BL0 to BL7 and the read global bit line RGBL1. The column select circuits WLY0 to WLY7 may be controlled by receiving first selection signals WC0 to WC7, and the local column select circuits RLY0 to RLY7 may be controlled by receiving second selection signals RC0 to RC7.

Figure 6:
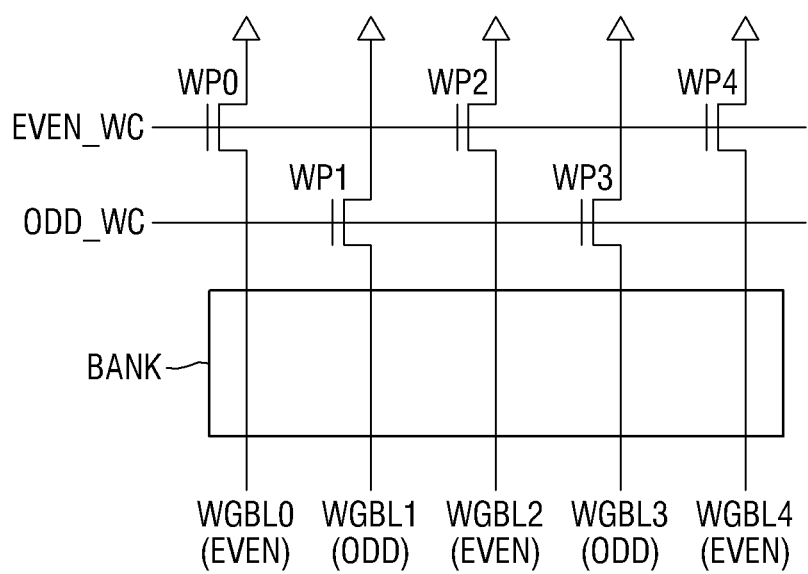
FIG. 6 is a block diagram illustrating a nonvolatile memory device according to an embodiment of the present inventive concept.
Figure 7:
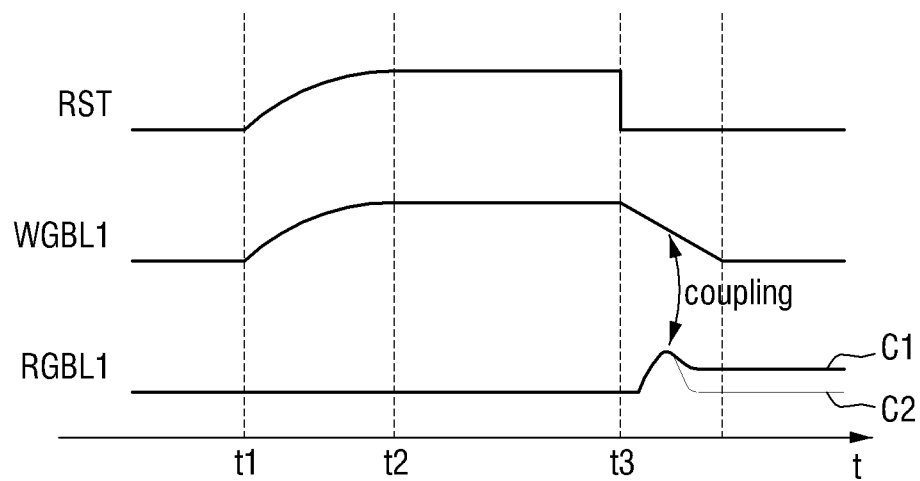
FIG. 7 is a timing diagram for reference in describing an operation of a nonvolatile memory device according to an embodiment of the present inventive concept.

FIG. 6 is a block diagram illustrating a nonvolatile memory device according to an embodiment of the present inventive concept. For brevity, read global bit lines, nonvolatile memory cells, etc. are not illustrated in FIG. 6. FIG. 7 is a timing diagram illustrating the operation of a nonvolatile memory device according to an embodiment of the present inventive concept.

First, referring to FIG. 6, a plurality of write global bit lines WGBL0 to WGBL4 are sequentially arranged. For example, the expression "the write global bit line WGBL1 and the write global bit line WGBL2 are directly adjacent to each other" means that no intervening write global bit line is disposed between the write global bit line WGBL1 and the write global bit line WGBL2.

In addition, the plurality of write global bit lines WGBL0 to WGBL4 may be connected to pass circuits WP0 to WP4, respectively. The pass circuits WP0 to WP4 may be positioned within the banks BANK0 to BANK7. Alternatively, the pass circuits WP0 to WP4 may be positioned at one-side terminal ends of the banks BANK0 to BANK7 or at both-side terminal ends of the banks BANK0 to BANK7.

Here, the plurality of write global bit lines WGBL0 to WGBL4 may be divided into a plurality of even-numbered write global bit lines WGBL0, WGBL2 and WGBL4 and a plurality of odd-numbered write global bit lines WGBL1 and WGBL3. In addition, the plurality of even-numbered write global bit lines WGBL0, WGBL2 and WGBL4, and the plurality of odd-numbered write global bit lines WGBL1 and WGBL3 may be differently controlled. That is to say, a first pass signal EVEN_WC may be applied to the even-numbered pass circuits WP0, WP2 and WP4, and a second pass signal ODD_WC may be applied to the odd-numbered pass circuits WP1 and WP3.

For example, during a standby period, the first pass signal EVEN_WC and the second pass signal ODD_WC are both at a low level. Therefore, all of the plurality of even-numbered write global bit lines WGBL0, WGBL2 and WGBL4, and the plurality of odd-numbered write global bit lines WGBL1 and WGBL3 may float.

Meanwhile, during a write period, for example, in order to write data to the even-numbered write global bit lines WGBL0, WGBL2 and WGBL4, a first pass signal EVEN_WC is maintained at a low level, and a second pass signal ODD_WC may be changed from a low level to a high level. That is to say, since the odd-numbered pass circuits WP1 and WP3 are turned on, a ground voltage may be applied to the odd-numbered write global bit lines WGBL1 and WGBL3. A write current is applied to at least one of the even-numbered write global bit lines WGBL0, WGBL2 and WGBL4 to perform a write operation.

Conversely, in order to write data to the odd-numbered write global bit lines WGBL1 and WGBL3, the second pass signal ODD_WC is maintained at a low level and the first pass signal EVEN_WC may be changed from a low level to a high level. That is to say, since the even-numbered pass circuits WP0, WP2 and WP4 are turned on, a ground voltage may be applied to the even-numbered write global bit lines WGBL0, WGBL2 and WGBL4. A write current is applied to at least one of the odd-numbered write global bit lines WGBL1 and WGBL3 to perform a write operation.

To sum up, while a write current is applied to the write global bit line WGBL1, for example, a ground voltage may be applied to write global bit lines WGBL0 and WGBL2 directly adjacent to the write global bit line WGBL1, which will later be described in detail with reference to FIG. 7. FIG. 7 illustrates a case in which a read while write (RWW) operation is performed. That is to say, during the RWW operation, voltage waveforms of the write global bit line WGBL1 and the read global bit line RGBL1 are illustrated in FIG. 7.

Referring to the example of FIG. 7, at time t1, for example, in order to write reset data to a bank (e.g., BANK6), a write circuit applies a reset current RST to the write global bit line WGBL1. Here, the voltage waveform of the write global bit line WGBL1 also increases.

At time t2, the reset current RST may reach a preset size and may not further increase.

At time t3, the write circuit supplies no more reset current RST, and voltage waveforms of the write global bit line WGBL2 start to slowly decrease.

Meanwhile, data stored in a bank (e.g., BANK1) different from a bank (e.g., BANK6) where a write operation is being performed may be read. The data stored in the bank (e.g., BANK1) may be transferred to a sense amplifier through the read global bit line RGBL1.

Meanwhile, a parasitic capacitor (cc of FIG. 5) may exist between a write global bit line (e.g., WGBL1) and a read global bit line (e.g., RGBL1) which are adjacent to each other. A sharp variation in the voltage generated in the write global bit line WGBL1 may be transferred to the read global bit line RGBL1 through the parasitic capacitor cc, which will be referred to as an RWW coupling noise. The RWW coupling noise may reduce a sensing margin of a read operation.

For example, while the write current is applied to the write global bit line WGBL1, if the write global bit lines WGBL0 and WGBL2 directly adjacent to the write global bit line WGBL1 float, a capacitor viewed from the write global bit line WGBL1 (or the read global bit line RGBL1) may have a relatively small size. Thus, according to the variation in the voltage of the write global bit line WGBL1 (that is, by coupling), the read global bit line RGBL1 may also undergo a severely sharp variation in the voltage (C2 of FIG. 7). In this case, the sensing margin of the read operation may be extremely small.

In the nonvolatile memory device according to an embodiment of the present inventive concept, while the write current is applied to the write global bit line WGBL1, a ground voltage is applied to the write global bit lines WGBL0 and WGBL2 directly adjacent to the write global bit line WGBL1. In this case, the capacitor viewed from the write global bit line WGBL1 (or the read global bit line RGBL1) may have a relatively large size. Thus, according to the variation in the voltage of the write global bit line WGBL1 (that is, by coupling), the read global bit line RGBL1 may also undergo a small variation in the voltage (C1 of FIG. 7). In this case, the sensing margin of the read operation may increase. That is to say, in the nonvolatile memory device according to an embodiment of the present inventive concept, the RWW coupling noise can be reduced by relieving the sharp variation of voltage applied to the write global bit lines WGBL0 to WGBL7.

Meanwhile, a fixed voltage other than the ground voltage may be applied to the write global bit lines WGBL0 and WGBL2. That is to say, any kind of voltage may be applied so long as a capacitor viewed from the write global bit line WGBL1 can be increased in size.

Figure 8:
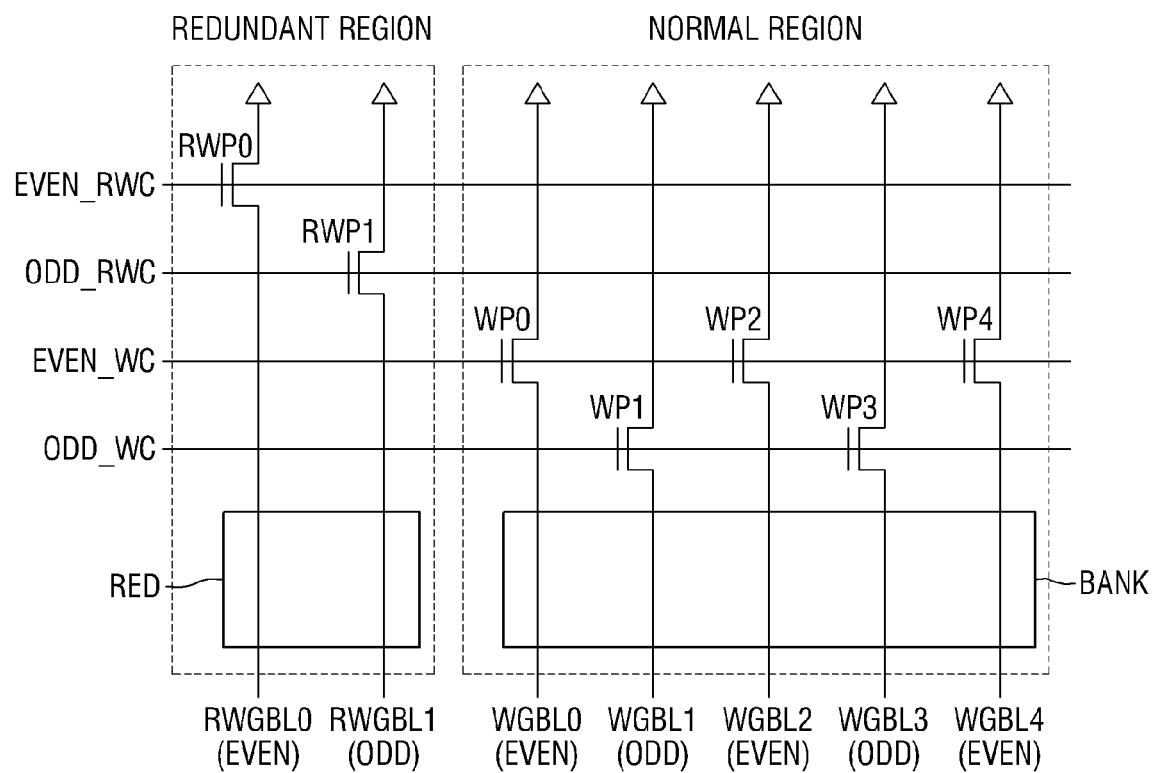
FIG. 8 is a block diagram illustrating a nonvolatile memory device according to another embodiment of the present inventive concept.

FIG. 8 is a block diagram illustrating a nonvolatile memory device according to another embodiment of the present inventive concept. For the sake of convenient explanation, the following description will focus on differences between the nonvolatile memory device according to the present embodiment and the previous embodiment shown in FIGS. 6 and 7.

Referring to FIG. 8, the nonvolatile memory device according to another embodiment of the present inventive concept may include a normal region and a redundant region.

As described above, a plurality of even-numbered write global bit lines and a plurality of odd-numbered write global bit lines may be arranged in a normal region and may be separately controlled.

The plurality of even-numbered redundant write global bit lines RWGBL0 and the plurality of odd-numbered redundant write global bit lines RWGBL1, which are separately controlled, may be provided in a redundant region.

The even-numbered redundant write global bit lines RWGBL0 are connected to a redundant pass circuit RWP0 and the odd-numbered redundant write global bit lines RWGBL1 are connected to a redundant pass circuit RWP1.

Meanwhile, even-numbered write global bit lines WGBL0, WGBL2 and WGBL4 and the even-numbered redundant write global bit lines RWGBL0 may be controlled separately from each other, and odd-numbered write global bit lines WGBL1 and WGBL3 and the odd-numbered redundant write global bit line RWGBL1 may be controlled separately from each other. That is to say, a first pass signal EVEN_WC and a first redundant pass signal EVEN_RWC may not currently go high/low, and a second pass signal ODD_WC and a second redundant pass signal ODD_RWC may not currently go high/low.

For example, the even-numbered write global bit line (e.g., WGBL2) in the normal region may be repaired by the odd-numbered redundant write global bit line (e.g., RWGBL1) in the redundant region. In this case, the first pass signal EVEN_WC and the second redundant pass signal ODD_RWC may concurrently go high/low.

As described above, the even-numbered write global bit lines WGBL0, WGBL2 and WGBL4, the even-numbered redundant write global bit line RWGBL0, odd-numbered write global bit lines WGBL1 and WGBL3, and the odd-numbered redundant write global bit line RWGBL1 are controlled separately from each other, thereby improving RWW noises without reduction in the column repairing efficiency.

Figure 9:
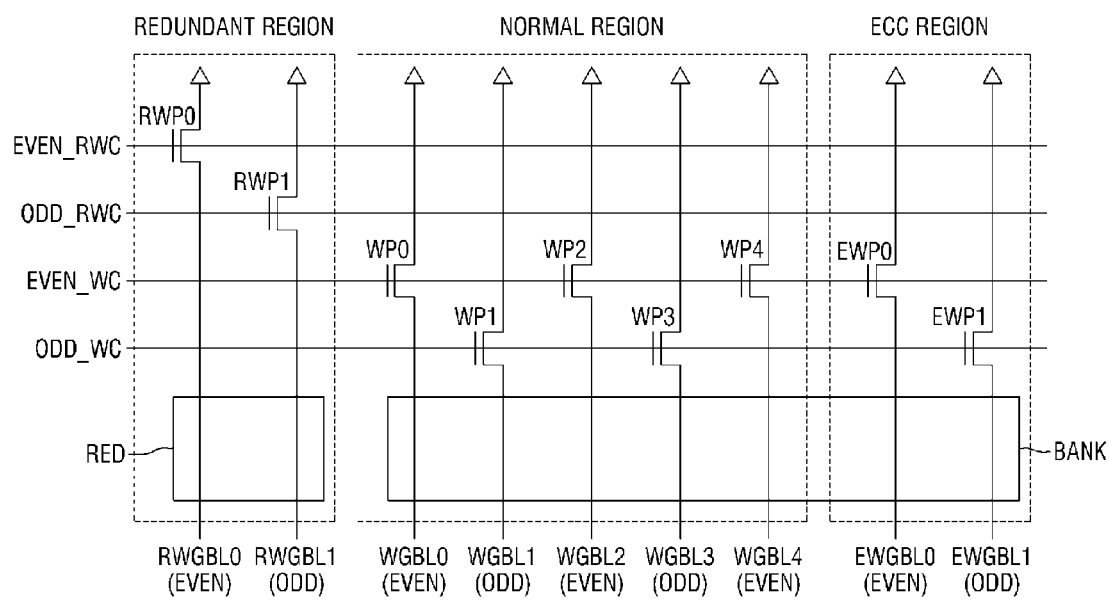
FIG. 9 is a block diagram illustrating a nonvolatile memory device according to still another embodiment of the present inventive concept.

FIG. 9 is a block diagram illustrating a nonvolatile memory device according to still another embodiment of the present inventive concept. For the sake of convenient explanation, the following description will focus on differences between the nonvolatile memory device according to the present embodiment and the previous embodiment shown in FIGS. 6 and 7.

Referring to FIG. 9, the nonvolatile memory device according to still another embodiment of the present inventive concept may include a normal region, a redundant region and an error correction code (ECC) region.

A plurality of even-numbered ECC write global bit lines EWGBL0 and a plurality of odd-numbered ECC write global bit lines EWGBL1, which are separately controlled, may further be provided in the ECC region.

In the exemplary embodiment shown in FIG. 9, the even-numbered write global bit lines WGBL0, WGBL2 and WGBL4, the even-numbered ECC write global bit lines EWGBL0 are concurrently controlled, and the odd-numbered write global bit lines WGBL1 and WGBL3, and the odd-numbered ECC write global bit lines EWGBL1 are also concurrently controlled. That is to say, the even-numbered write global bit lines WGBL0, WGBL2 and WGBL4 and the even-numbered ECC write global bit lines EWGBL0 may receive a first pass signal EVEN_WC, and the odd-numbered write global bit lines WGBL1 and WGBL3 and the odd-numbered ECC write global bit lines EWGBL1 may receive a second pass signal ODD_WC.

Alternatively, the even-numbered write global bit lines WGBL0, WGBL2 and WGBL4 and the even-numbered ECC write global bit lines EWGBL0 may be separately controlled, and the odd-numbered write global bit lines WGBL1 and WGBL3 and the odd-numbered ECC write global bit lines EWGBL1 may be separately controlled.

Figure 10:
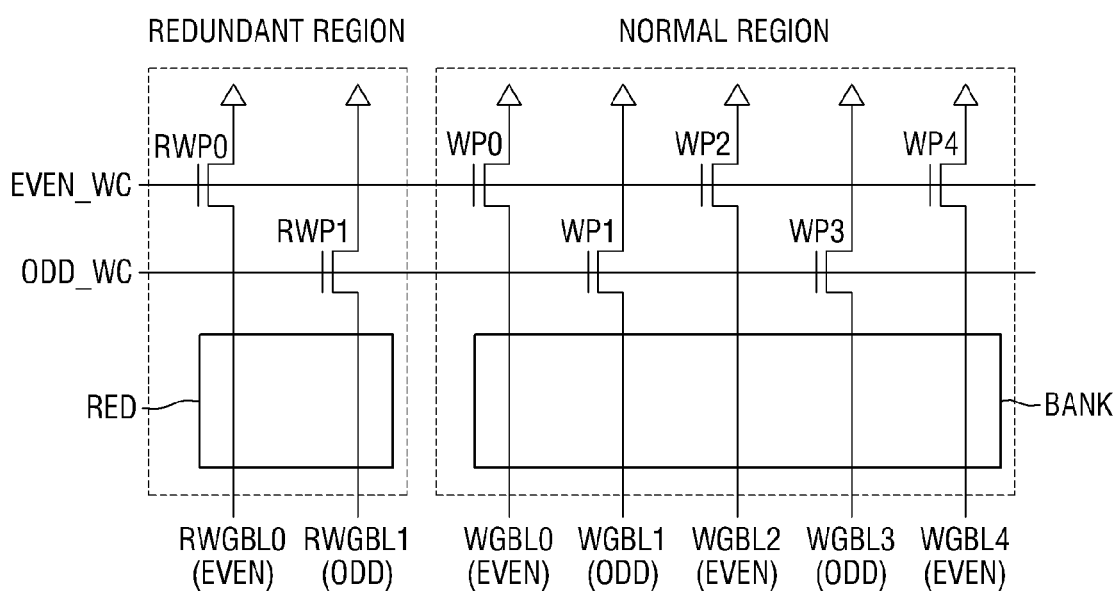
FIG. 10 is a block diagram illustrating a nonvolatile memory device according to still another embodiment of the present inventive concept.

FIG. 10 is a block diagram illustrating a nonvolatile memory device according to still another embodiment of the present inventive concept.

Referring to FIG. 10, a plurality of even-numbered redundant write global bit lines RWGBL0 and a plurality of odd-numbered redundant write global bit lines RWGBL1, which are separately controlled, may be provided in a redundant region.

However, the even-numbered write global bit lines WGBL0, WGBL2 and WGBL4 and the even-numbered redundant write global bit lines RWGBL0 may be concurrently controlled, and the odd-numbered write global bit lines WGBL1 and WGBL3 and the odd-numbered redundant write global bit lines RWGBL1 may be concurrently controlled. In this case, the column repairing efficiency may be somewhat reduced, compared to a case of the previous embodiment shown in FIG. 8.

FIGS. 11 to 15 illustrate memory systems according to some embodiments of the present inventive concept. Specifically, FIGS. 11 to 15 illustrate memory systems using nonvolatile memory devices according to some embodiments of the present inventive concept.

Figure 11:
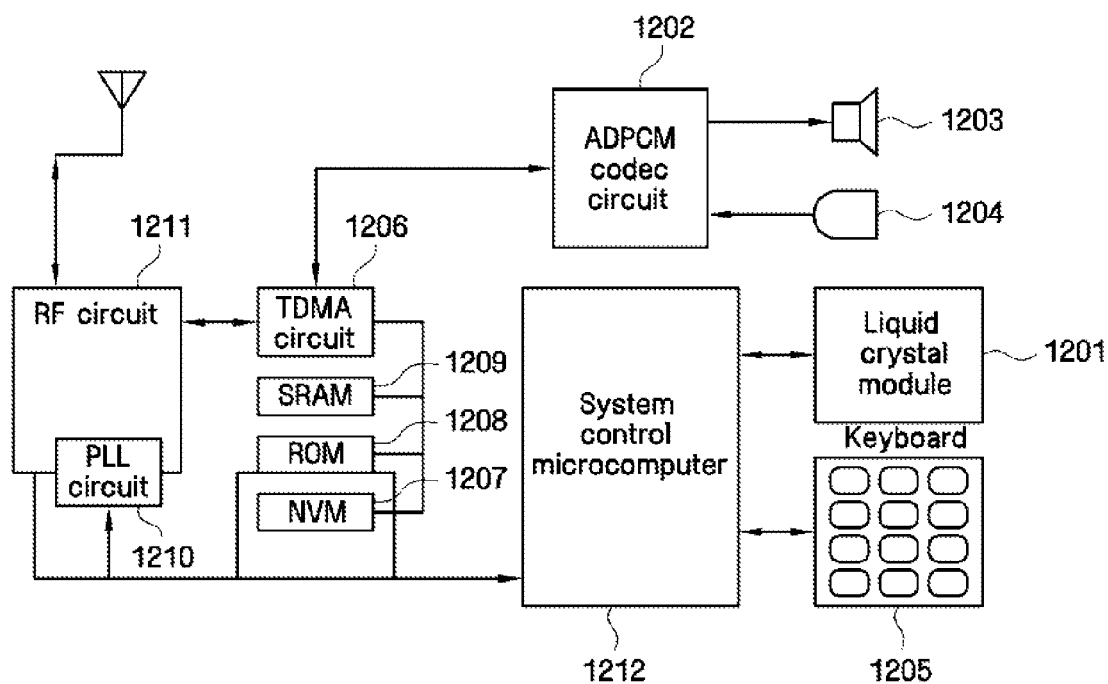
FIGS. 11 to 15 illustrate memory systems according to some embodiments of the present inventive concept.

FIG. 11 illustrates a cellular phone system using nonvolatile memory devices according to some embodiments of the present inventive concept.

Referring to FIG. 11, the cellular phone system may include an adaptive differential pulse code modulation (ADPCM) codec circuit 1202 that compresses sound or decompresses compressed sound, a speaker 1203, a microphone 1204, a time division multiple access (TDMA) circuit 1206 that time-multiplexes digital data, a phase-locked loop (PLL) circuit 1210 that sets a carrier frequency of a radio signal, a radio frequency (RF) circuit 1211 that transmits or receives a radio signal.

In addition, the cellular phone system may include various kinds of memory devices, for example, a nonvolatile memory device 1207, a random access memory (ROM) 1208, and a static RAM (SRAM) 1209. The nonvolatile memory devices according to some embodiments of the present inventive concept may be used as the nonvolatile memory device 1207 and may store an ID number, for example. The ROM 1208 may store a program, and the SRAM 1209 may serve as a working area for a system control microcomputer 1212 or may temporarily store data. Here, the system control microcomputer 1212 may be a processor controlling a write operation and a read operation of the nonvolatile memory device 1207.

Figure 12:
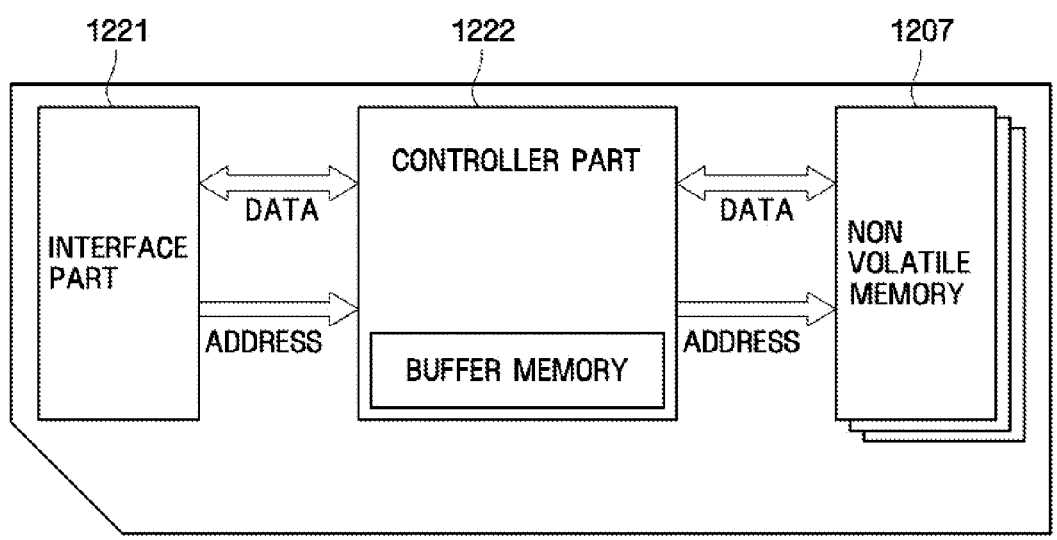

FIG. 12 illustrates a memory card using nonvolatile memory devices according to some embodiments of the present inventive concept. Examples of the memory card may include an MMC card, a SD card, a multiuse card, a micro SD card, a memory stick, a compact SD card, an ID card, a PCMCIA card, an SSD card, a chipcard, a smartcard, a USB card, and so on.

Referring to FIG. 12, the memory card may include at least one of an interface part 1221 that performs interfacing with an external device, a controller part 1222 that has a buffer memory and controls the operation of the memory card, and the nonvolatile memory 1207 according to some embodiments of the present inventive concept. The controller part 1222 may be a processor that controls a write operation and a read operation of the nonvolatile memory 1207. In detail, the controller part 1222 is coupled to the nonvolatile memory 1207 and the interface part 1221 through a data bus DATA and an address bus ADDRESS.

Figure 13:
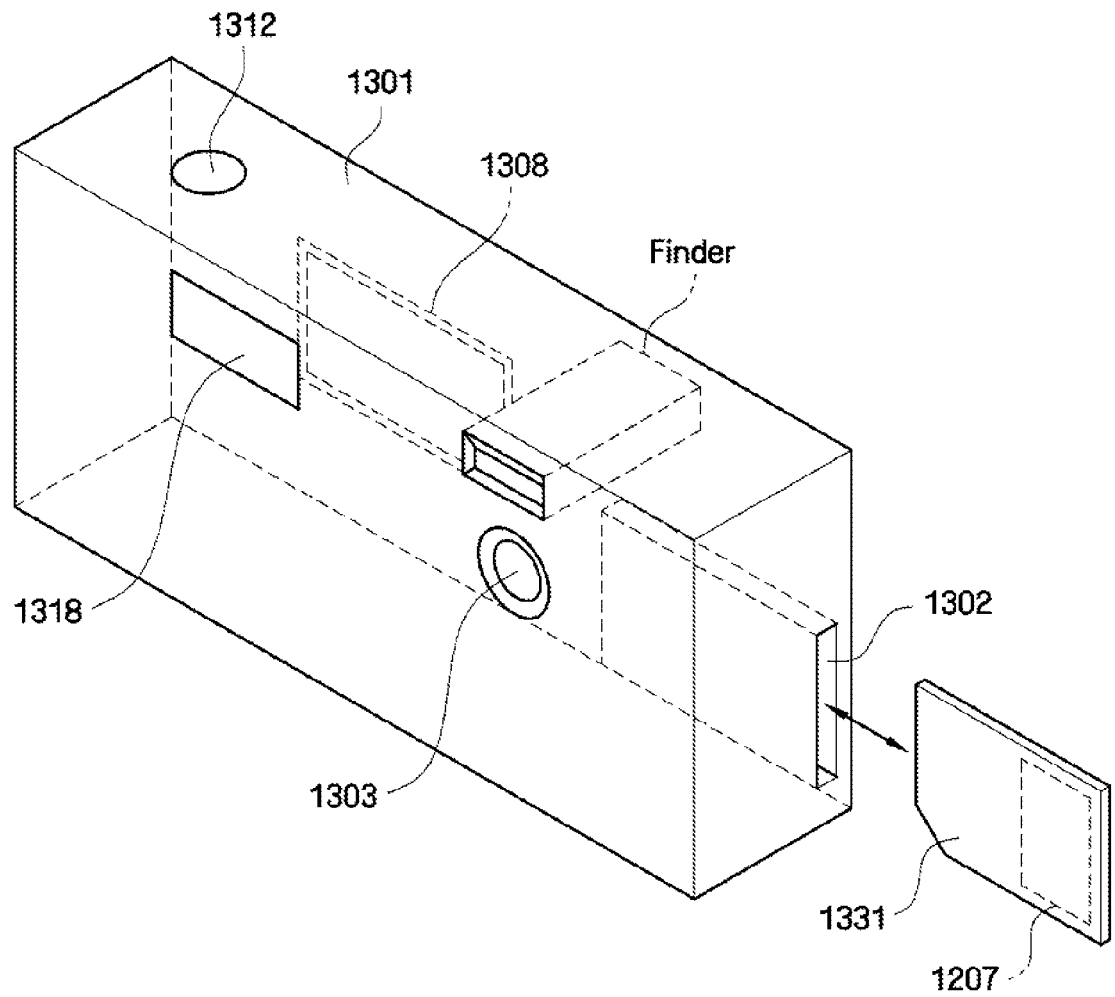

FIG. 13 illustrates a digital still camera using nonvolatile memory devices according to some embodiments of the present inventive concept.

Referring to FIG. 13, the digital still camera includes a body 1301, a slot 1302, a lens 1303, a display 1308, a shutter button 1312, and a strobe 1318. In particular, a memory card 1331 may be inserted into the slot 1308, and the memory card 1331 may include at least one nonvolatile memory device 1207 according to some embodiments of the present inventive concept.

When the memory card 1331 is of a contact type, it is brought into contact with a particular electric circuit on a printed circuit board when the memory card 1331 is inserted into the slot 1308. When the memory card 1331 is of a non-contact type, the memory card 1331 communicates with the memory card 1331 through a radio signal.

Figure 14:
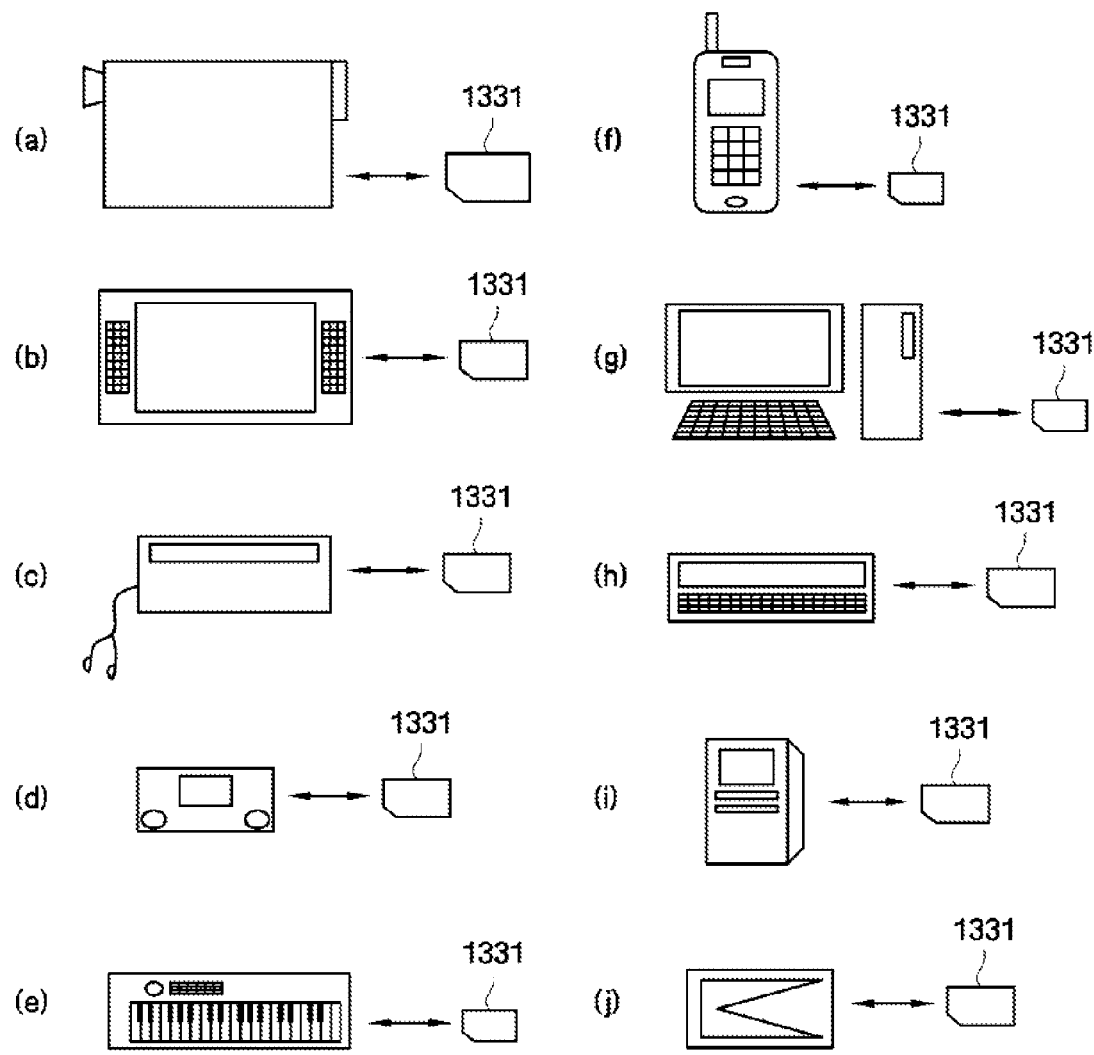

FIG. 14 illustrates various systems using the memory card shown in FIG. 12.

Referring to FIG. 14, the memory card 1331 may be applied to (a) a video camera, (b) a television, (c) an audio device, (d) a game device, (e) an electronic musical instrument, (f) a cellular phone, (g) a computer, (h) a personal digital assistant (PDA), (i) a voice recorder, (j) a PC card, and so on.

Figure 15:
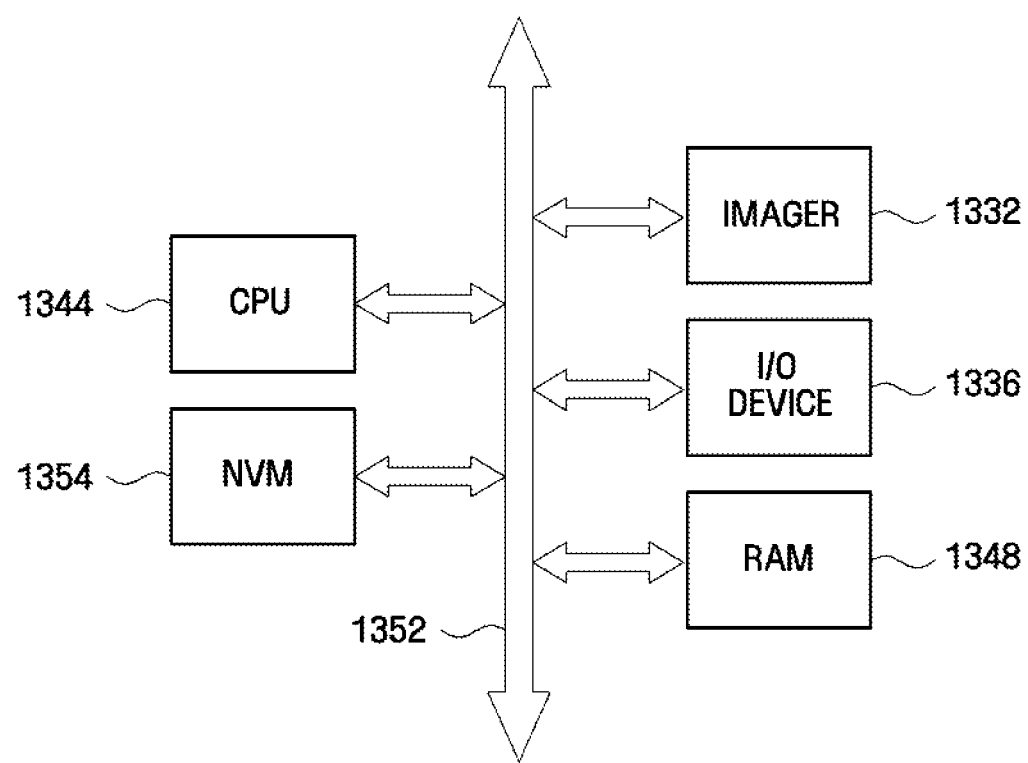

FIG. 15 illustrates an image sensor system using nonvolatile memory devices according to some embodiments of the present inventive concept.

Referring to FIG. 15, the image sensor system may include an imager 1332, an input/output (I/O) device 1336, a random access memory (RAM) 1348, a CPU 1344, and a nonvolatile memory device (NVM) 1354 according to some embodiments of the present inventive concept.

The respective functional components, including the imager 1332, the I/O device 1336, the RAM 1348, the CPU 1344 and the NVM 1354, may communicate with one another through a bus 1352. The imager 1332 may include a photo sensing element, such as a photogate, a photodiode, or the like. The respective functional components may be incorporated into a chip with a processor and may be formed by separate chips from a processor.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A nonvolatile memory device comprising:
   a plurality of banks including a plurality of nonvolatile memory cells, each nonvolatile memory cell being formed with resistive material; and
   first to third write global bit lines arranged to cross the plurality of banks and disposed directly adjacent to one another in order,
   wherein when a write current is supplied to the first write global bit line during a write period, a fixed voltage is applied to the second write global bit line and the third write global bit line floats, and
   wherein the write period is a read while write (RWW) period.

2. The nonvolatile memory device of claim 1, wherein the fixed voltage is a ground voltage.

3. The nonvolatile memory device of claim 1, further comprising a fourth write global bit line arranged at a different side from the second write global bit line with respect to the first write global bit line and disposed directly adjacent to the first write global bit line, wherein when the write current is supplied to the first write global bit line during the write period, the fixed voltage is applied to the fourth write global bit line.

4. The nonvolatile memory device of claim 1, wherein during a standby period, the first to third write global bit lines float.

5. A nonvolatile memory device comprising:
   a plurality of banks including a plurality of nonvolatile memory cells, each nonvolatile memory cell being formed with resistive material; and
   a plurality of even-numbered write global bit lines and a plurality of odd-numbered write global bit lines arranged to cross the plurality of banks,
   wherein when a write current is supplied to at least one of the plurality of even-numbered write global bit lines during a write period, a fixed voltage is applied to the plurality of odd-numbered write global bit lines, and wherein the write period is a read while write (RWW) period.

6. The nonvolatile memory device of claim 5, wherein the fixed voltage is a ground voltage.

7. The nonvolatile memory device of claim 5, wherein the plurality of even-numbered write global bit lines and the plurality of odd-numbered write global bit lines are arranged in a normal region.

8. The nonvolatile memory device of claim 7, further comprising a plurality of even-numbered redundant write global bit lines and a plurality of odd-numbered redundant write global bit lines arranged in a redundant region, the plurality of even-numbered redundant write global bit lines and the plurality of odd-numbered redundant write global bit lines being separately controlled.

9. The nonvolatile memory device of claim 8, wherein the even-numbered write global bit lines and the even-numbered redundant write global bit lines are concurrently controlled, and the odd-numbered write global bit lines and the odd-numbered redundant write global bit lines are concurrently controlled.

10. The nonvolatile memory device of claim 8, wherein the even-numbered write global bit lines, the even-numbered redundant write global bit lines, the odd-numbered write global bit lines, and the odd-numbered redundant write global bit lines are separately controlled.

11. The nonvolatile memory device of claim 10, wherein one of the plurality of even-numbered write global bit lines is repaired by one of the odd-numbered redundant write global bit lines.

12. The nonvolatile memory device of claim 10, wherein when the write current is supplied to at least one of the plurality of even-numbered write global bit lines during the write period, the fixed voltage is applied to the plurality of odd-numbered write global bit lines.

13. The nonvolatile memory device of claim 7, further comprising a plurality of even-numbered error correction code (ECC) write global bit lines and a plurality of odd-numbered ECC write global bit lines arranged in ECC region, the plurality of even-numbered ECC write global bit lines and the plurality of odd-numbered ECC write global bit lines being separately controlled.

14. The nonvolatile memory device of claim 13, wherein the even-numbered write global bit lines, the even-numbered ECC write global bit lines, the odd-numbered write global bit lines, and the odd-numbered ECC write global bit lines are separately controlled.

15. A memory card comprising:
an interface unit configured to interface with an external device;
a controller configured to operate the memory card, the controller including a buffer; and
a nonvolatile memory including:
a plurality of banks including a plurality of nonvolatile memory cells;
a plurality of even-numbered write global bit lines arranged to cross the plurality of banks and disposed in a normal region;
a plurality of odd-numbered write global bit lines arranged to cross the plurality of banks and disposed in the normal region;
a plurality of even-numbered redundant write global bit lines disposed in a redundant region;
a plurality of odd-numbered redundant write global bit lines disposed in the redundant region;
a plurality of even-numbered error correction code (ECC) write global bit lines disposed in an ECC region; and
a plurality of odd-numbered ECC write global bit lines disposed in the ECC region,
wherein the plurality of even-numbered ECC write global bit lines and the plurality of odd-numbered ECC write global bit lines are separately controlled.

16. The memory card of claim 15, wherein the plurality of even-numbered write global bit lines and the plurality of even-numbered ECC write global bit lines are concurrently controlled, and
the plurality of odd-numbered write global bit lines and the plurality of odd-numbered ECC write global bit lines are concurrently controlled.

17. The memory card of claim 15, wherein the plurality of even-numbered write global bit lines and the plurality of even-numbered ECC write global bit lines are separately controlled, and
the plurality of odd-numbered write global bit lines and the plurality of odd-numbered ECC write global bit lines are separately controlled.

18. The memory card of claim 15, wherein the nonvolatile memory includes:
a global column select circuit;
a global sense amplifier circuit configured to read data from the plurality of nonvolatile memory cells; and
a global write driver circuit configured to write the data to the plurality of nonvolatile memory cells.

* * * * *